United States Patent [19]

Collins

[11] 4,057,786

[45] Nov. 8, 1977

[54] RECIRCULATING DELAY LINE TIME COMPRESSOR HAVING PLURAL INPUT TAPS

[75] Inventor: John D. Collins, Burlington, Mass.

[73] Assignee: Raytheon Company, Lexington, Mass.

[21] Appl. No.: 684,517

[22] Filed: May 10, 1976

Related U.S. Application Data

[60] Continuation of Ser. No. 513,352, Oct. 9, 1974, abandoned, which is a division of Ser. No. 346,389, March 30, 1973, Pat. No. 3,879,661, which is a continuation of Ser. No. 229,210, Feb. 1, 1972, abandoned.

[51] Int. Cl.² .............................................. G11C 21/00
[52] U.S. Cl. ................................... 365/76; 235/92 SH
[58] Field of Search ................................ 340/173 RC

[56] References Cited

U.S. PATENT DOCUMENTS

| | | | |
|---|---|---|---|
| 2,782,305 | 2/1957 | Havens et al. | 340/173 RC |
| 3,153,776 | 10/1964 | Schwartz | 340/173 RC |
| 3,299,406 | 1/1967 | Isberg | 340/173 RC |
| 3,302,176 | 1/1967 | McLaughlin | 340/173 RC |

OTHER PUBLICATIONS

Heiter, 1000-MHz 100-Bit Ultrasonic Digital Delay-Line Time-Compression Store, IEEE Journal of Solid-State Circuits, vol. SC-6, No. 2, Apr. 1971, pp. 61-71.

*Primary Examiner*—Stuart N. Hecker
*Attorney, Agent, or Firm*—Richard M. Sharkansky; Joseph D. Pannone; Philip J. McFarland

[57] ABSTRACT

A signal processor suitable for real time processing of a complex signal having a relatively narrow frequency spectrum is disclosed. Such signal processor includes a so-called delay line time compressor adapted to receive digital signals corresponding to samples of the complex signal into selected stages thereof and to convert such digital signals into a resulting complex signal, analogous to the complex signal being processed, but having a relatively wide frequency spectrum. The signal processor also includes a digitally controlled oscillator in combination with a single side band generator to produce frequency-varying heterodyning signals which, when mixed with the resulting complex signal, permit separation of the frequency components of such resulting signal to permit any further separate processing of each one of such components.

1 Claim, 11 Drawing Figures

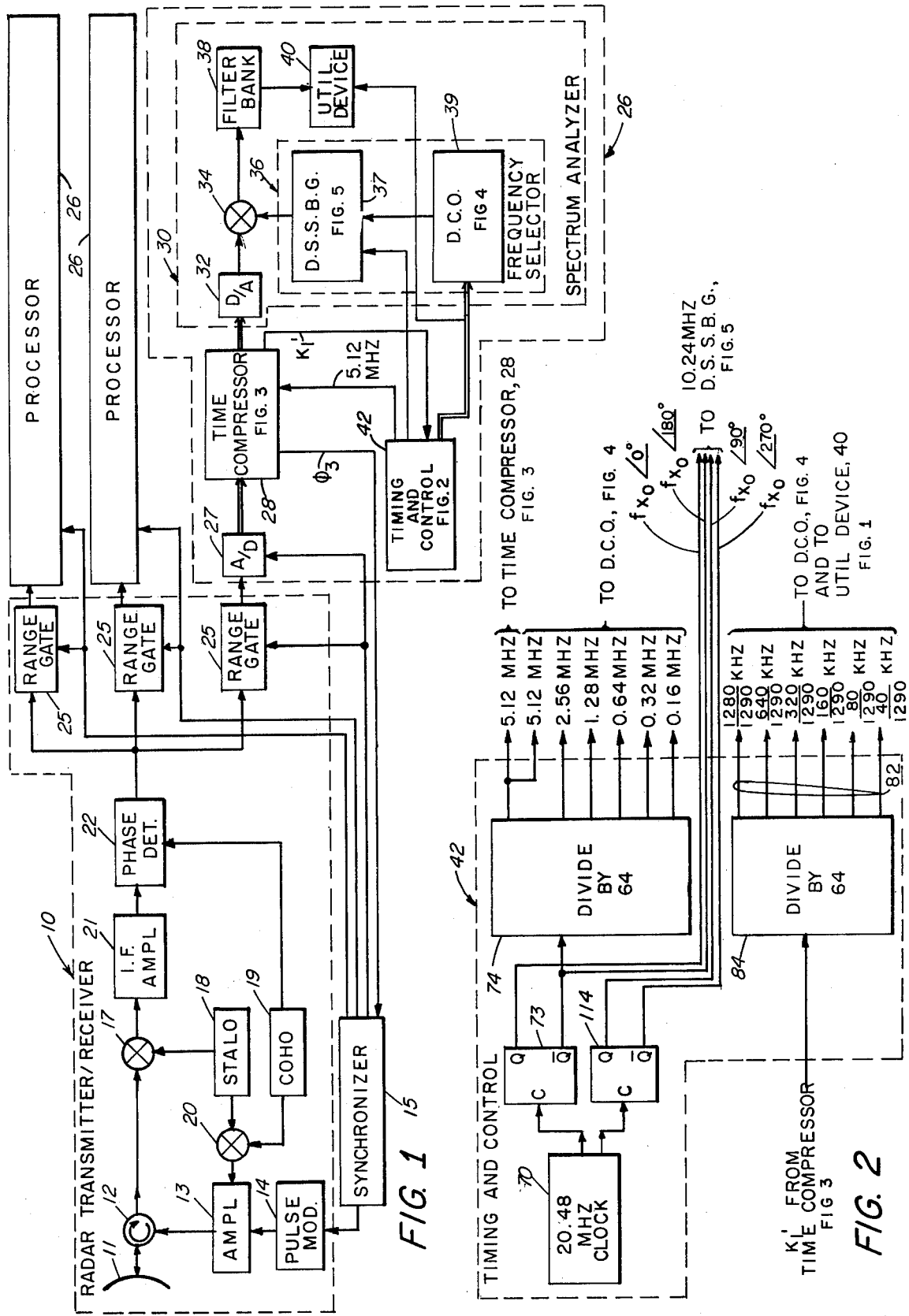

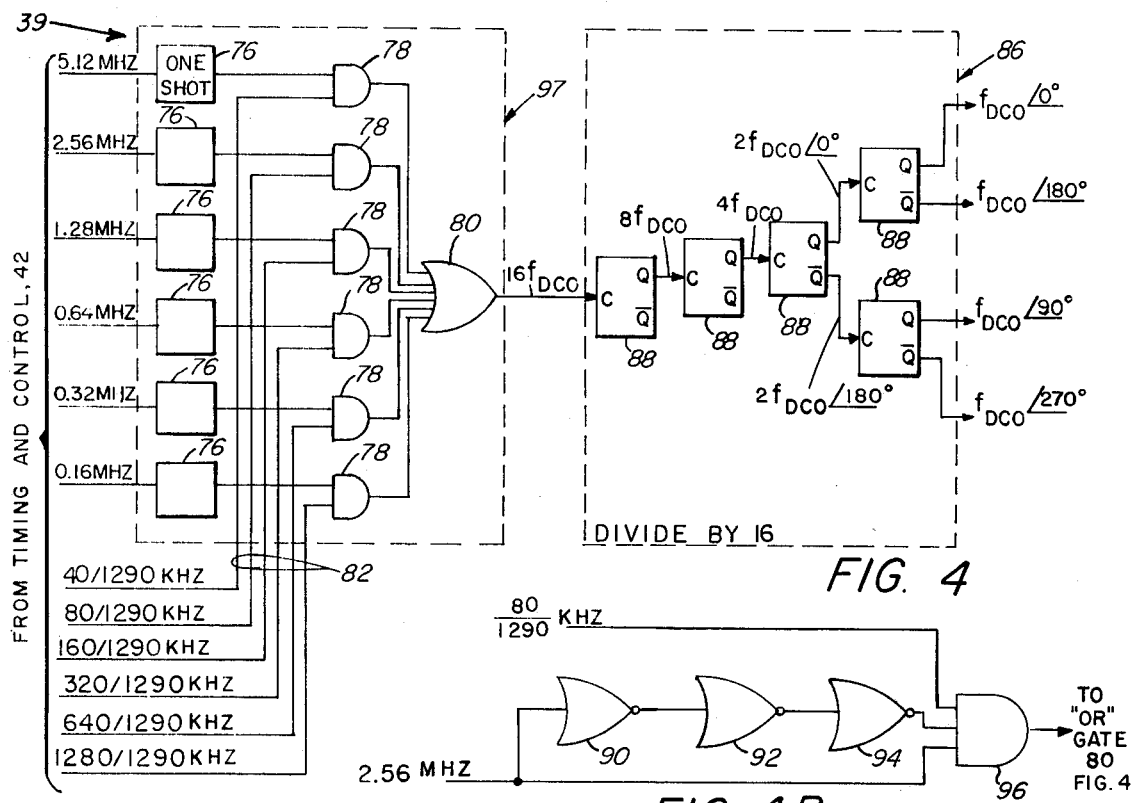
FIG. 4
FIG. 4B
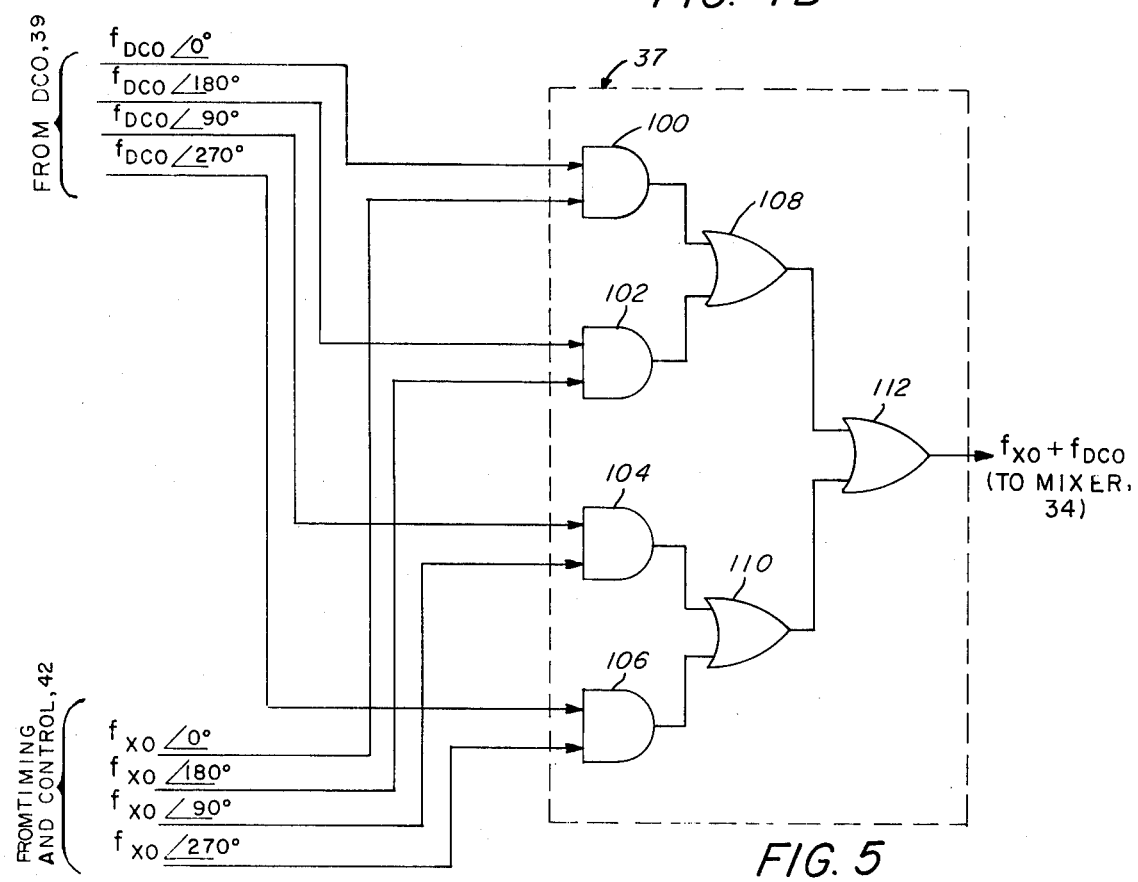
FIG. 5

RECIRCULATING DELAY LINE TIME COMPRESSOR HAVING PLURAL INPUT TAPS

CROSS-REFERENCE TO RELATED CASES

This is a continuation of application Ser. No. 513,352, now abandoned, filed Oct. 9, 1974 which is a division of application Ser. No. 346,389 filed Mar. 30, 1973 (now U.S. Pat. No. 3,879,661) which is a continuation of application Ser. No. 229,210 filed Feb. 1, 1972, now abandoned.

BACKGROUND OF THE INVENTION

This invention relates generally to signal processors and subassemblies therefor and more particularly to such signal processors wherein real time digital processing techniques are used.

As is known in the art, signal processors have been used extensively in many applications such as in sonar and radar. For example, a signal processor may be used in a radar receiver for determining the Doppler frequency associated with a detected object. In such radar receiver a bipolar video signal is produced in response to each one of a train of transmitted pulses. A predetermined time after each one of the train of pulses is transmitted, the bipolar video signal is sampled to obtain a set of such signals over a relatively long period of time. The rate of change in amplitude between samples in such a set is indicative of the Doppler frequency of an object contributing to such amplitude. As is known, such a set of sampled bipolar video signals may be passed through a spectrum analyzer to determine such Doppler frequency. The number of sampled bipolar video signals in each such set being related to the Doppler frequency resolution desired. For known reasons, inter alia reliability considerations, it is desirable that the signal processor process the samples of the bipolar video signal digitally. It follows then that such signal processor should use, as far as practical, digitally operative subassemblies.

One subassembly, however, which may not be practical to implement digitally is the spectrum analyzer. That is, while it is known that fast Fourier transform (FFT) devices may be used as a spectrum analyzer, such devices are generally complex and require extensive digital circuitry. Therefore, it is sometimes more practical to use a bank of analog filters as the frequency analyzer. One difficulty in using such a bank of analog filters may exist where the range of Doppler frequencies associated with an object is relatively narrow. In order to increase the actual range of Doppler frequencies in such cases, time compression techniques have generally been used. Such time compression techniques have sometimes been implemented in accordance with U.S. Pat. No. 2,958,039 entitled "Delay Line Time Compressor," issued Oct. 25, 1960 to V. C. Anderson. Briefly, according to the just-cited patent, samples of a bipolar video frequency are taken at a relatively low rate. Successive ones of the samples are coupled directly to a recirculating delay line having a time delay so related to the rate at which the samples are taken that the output signal from such delay line ultimately is made up of successive samples at a much higher rate. Consequently, the frequency spectrum of such output signal is increased correspondingly relative to the frequency spectrum of the bipolar video signal coupled to such time compressor. Therefore, the use of a bank of analog filters is made practical. It is also known that the output signal from the recirculating delay line may be heterodyned with a frequency-varying signal produced by a frequency selector network to separate the frequency components in such output signal for analysis by the bank of analog filters. The signal produced by the frequency selector changes frequency in steps cyclically over a predetermined period of time. In this way, the bank of analog filters may be used on a "time shared" basis to analyze Doppler frequencies over a band of frequencies larger than the bandwidth of the bank of analog filters. The frequency selector network sometimes used includes a voltage controlled oscillator driving a single side band generator, the output of such single side band generator being the frequency-varying signal to be heterodyned with the output signal from the recirculating delay line. For reasons mentioned above it would be desirable, however, not to require the use of a completely analog processor but rather to permit a frequency selector network to be made up of digitally operative subassemblies, i.e. a digitally controlled oscillator and a digitally operative single side band generator.

In a known radar system wherein a Doppler frequency resolution requirement dictates the use of a set made up of 640 samples of the bipolar video signal, such samples occurring at a rate of about 10 KHZ, a time compressor mechanized according to U.S. Pat. No. 2,958,038 would require a delay line (for example a digital shift register) operating at a 6.4 MHZ rate. Known delay lines adapted to operate at such 6.4 MHZ rate are, however, relatively costly and complex.

SUMMARY OF THE INVENTION

With this background of the invention in mind it is an object of this invention to provide a signal processor suitable for real time digital processing.

It is another object of the invention to provide a signal processor having, as far as practical, digitally operative subassemblies.

It is another object of the invention to provide a signal processor wherein a frequency selector network is made up of digital subassemblies.

It is another object of the invention to provide, as subassembly of a signal processor, a digitally controlled oscillator.

It is another object of the invention to provide, as a subassembly of a signal processor, a digitally operative single side band generator.

It is a further object of the invention to provide a signal processor wherein a digital time compressor is used, such time compressor being operative at a frequency lower than any known time compressor when such signal processor is required to process a set of a given number of signals.

These and other objects of the invention are attained generally by providing, in a digital signal processor, a recirculating shift register to take the place of a delay line time compressor, such register having digital signals corresponding to samples of an analog signal applied at different selected stages to reduce the rate of operation required, and a frequency selector network, including a digitally controlled oscillator and a digital signal side band generator for producing a frequency-varying heterodyning signal to beat with the "time compressed" signal, thereby sequentially to separate the frequency components of the latter.

BRIEF DESCRIPTION OF THE DRAWINGS

Other objects and many of the attendant advantages of the invention will be readily appreciated as the same becomes better understood by reference to the following detailed description when considered in connection with the accompanying drawings wherein:

FIG. 1 is a block diagram showing a radar system according to the principles of the invention;

FIG. 2 is a block diagram showing a timing and control unit for the radar system illustrated in FIG. 1;

FIG. 4 is a block diagram of an embodiment of a digital controlled oscillator according to this invention;

FIG. 4B shows an alternate embodiment of the digital controlled oscillator shown in FIG. 4;

FIG. 5 is a block diagram of a digital single side band generator according to this invention.

DESCRIPTION OF THE PREFERRED EMBODIMENTS

Figure 3:
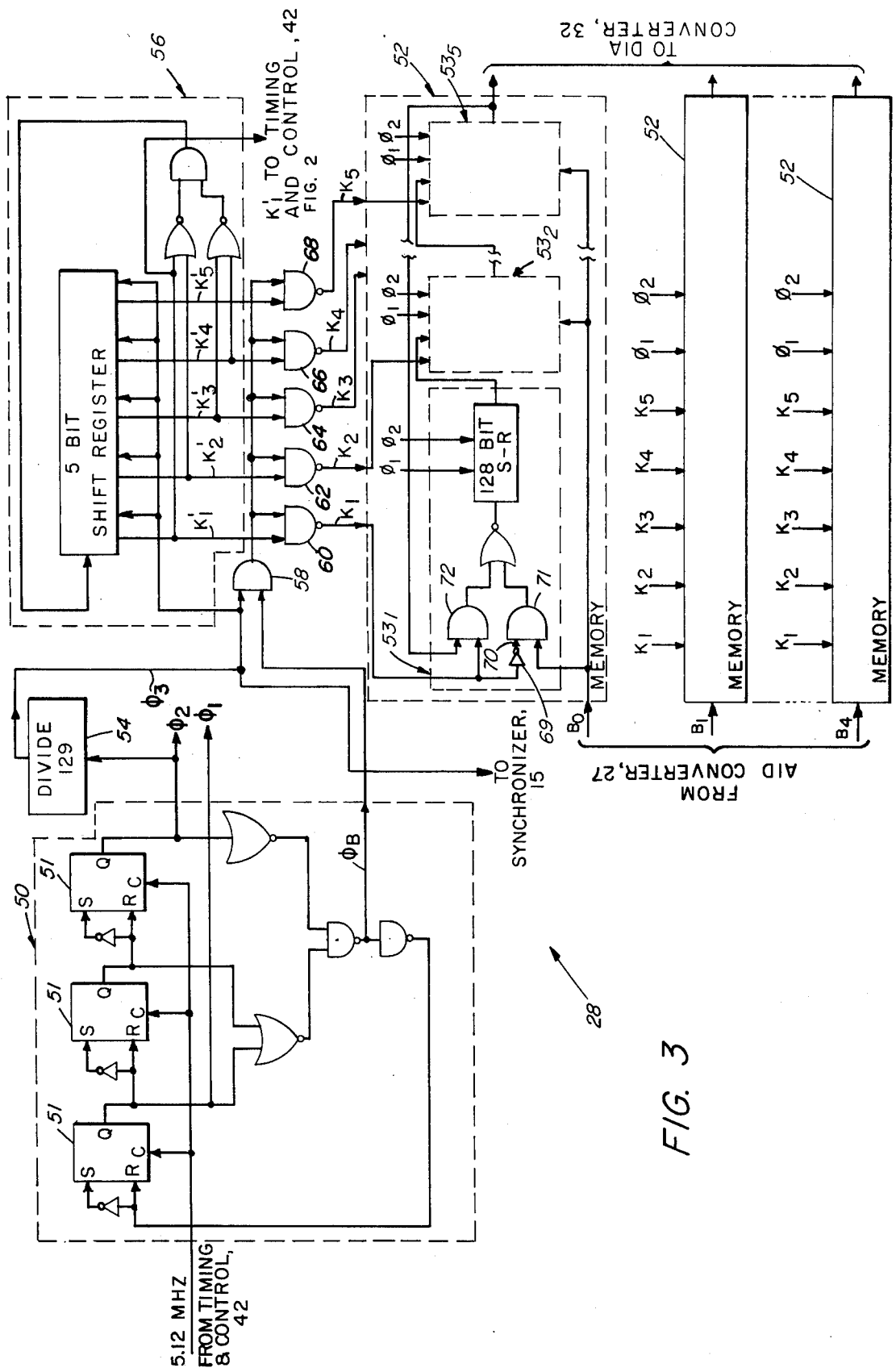
FIG. 3 is a block diagram showing a digital time compressor for the radar system of FIG. 1.

Referring now to FIG. 1, a coherent pulse Doppler radar system is shown, such system being suitable for use in a synthetic aperture radar application wherein real time signal processing is desired. The radar transmitter/receiver section 10 of such radar system includes an antenna 11 coupled through circulator 12 to an amplifier, here a klystron amplifier 13, pulse generator 14 and synchronizer 15 in a conventional manner whereby a train of pulses of radio frequency (RF) energy is transmitted at a desired PRF, here 1280/129 KHZ. Each one of the pulses in the train of transmitted pulses is reflected by various objects which are dispersed over various ranges from the antenna 11. A portion of the reflected energy produced in response to each transmitted pulse is received by antenna 11. The time at which a portion of such energy is received, relative to the time at which the transmitted pulse associated therewith is transmitted, corresponds to the range of the object causing such portion of the received energy. The energy received by antenna 11 passes through circulator 12. The signal at the output of circulator 12 is heterodyned in a conventional manner in mixer 17 with a signal produced by stable local oscillator (STALO 18). The signal produced by STALO 18 is heterodyned with a signal produced by a coherent oscillator (COHO 19) in a mixer 20 to produce a signal which is amplified by klystron amplifier 13 in a conventional manner. The signal produced at the output of mixer 17 is passed through IF amplifier 21 to phase detector 22. Phase detector 22 responds in a conventional manner to the signal produced by COHO 19 whereby the output signal from such phase detector 22 is a video frequency signal. The video frequency signal is applied to a desired number (here three) of range gates 25. Each one of the range gates 25 is actuated at a different predetermined time after each one of the transmitted pulses in response to a signal supplied by synchronizer 15. It follows then that the signal produced at the output of each one of the range gates 25 in response to a train of transmitted pulses of radio frequency energy may be characterized as a train of pulses, here having a 1280/129 KHZ data rate, with the level of each of the pulses in such train being related to the phase difference between the transmitted energy and the energy received from an object at a selected range. The pulse train out of the phase detector 22 is in the form of a bipolar video frequency signal, the rate of change in amplitude of such signal being related to the Doppler velocity of each object illuminated by the radar. The Doppler velocity of objects at any one of three selected ranges is here determined by one of three similar signal processors 26, each one of which is coupled to a respective one of such range gates 25 in a manner now to be described.

Signal processors 26 each include a conventional A/D converter 27. Such A/D converter 27 digitizes each one of the samples provided at the output of the particular range gate coupled thereto. Such A/D converter here provides 5 bit quantization of each such sample in a manner to enable parallel digital processing of the digital signals produced thereby. It is noted, however, that the number of bits in the quantization may be changed without departing from my inventive concepts. Therefore, each one of the A/D converters 27 operates in response to the signal which actuates the range gate 25 coupled thereto. That is, A/D converter 27 shown on the bipolar video signal out of the lowest range gate 25 operates in response to a signal produced by synchronizer 15, at a 1280/129 KHZ rate, such rate here being the Nyquist rate of the highest frequency signal to be processed. It follows then that the range of Doppler frequencies to be detected is 0 to ± 4.96 KHZ.

To determine the Doppler frequency of the bipolar video frequency signal with the here desired precision, a predetermined number, here a set of 645, of the digital signals produced by A/D converter 27 must be processed by a frequency spectrum analyzer 30, the details of which will be described later. Time compressor 28, the details of which will be discussed later, stores, at a 1280/129 KHZ data rate, the most recently obtained 640 digital signals produced by A/D converter 27. Time compressor 28 processes such stored digital signals in a manner such that successive sets, each one thereof made up of 645 digital signals, appears at the output of the time compressor 28 at a rate 129 higher than the 1280/129 KHZ data rate associated with A/D converter 27. Each one of the 645 digital signals making up each set appears at the output of time compressor 28 in the same relative order as it was produced by the A/D converter 27. That is, the digital signals in each successively retrieved set appear at the output of the time compressor 28 at a rate of 1.28 MHZ and in the same relative order as such digital signals were loaded into such time compressor. The effect of the time compressor 28 is therefore to multiply the actual Doppler frequency of the object by a factor of 129. (Such factor is commonly called the time compression factor). Because of the particular time compressor 28 used herein the first set of 645 digital words includes the first 645 digital words produced by A/D converter 27; the second set includes the 5th to 650th digital word produced by A/D converter 27; the third set includes the 10th to 655th digital word produced by A/D converter 27, and so forth.

The output signal from time compressor 28 is analyzed by spectrum analyzer 30, the details of which will be described later. Suffice it to say here that such spectrum analyzer 30 includes a conventional D/A converter 32 for converting the digital signals at the output of time compressor 28 into a corresponding analog signal. The analog signal is heterodyned in mixer 34 with a signal produced by frequency selector 36, the details of which will be described later. Suffice it to say here that such frequency selector 36 includes a digital single side band generator (D.S.S.B.G. 37) and a digital controlled oscillator (DCO 39), both of which will also be described later. The signal produced by the mixer 34 is analyzed by a filter bank 38. Here such filter bank 38 includes five narrow band filters, each one thereof having a 2 KHZ bandwidth centered at a frequency such that the filter bank 38 covers a 10 KHZ total bandwidth. Therefore, because of the time compression factor of 129, each one of the five narrow band filters detects actual Doppler frequencies within a 15.5 HZ bandwidth and the filter bank 38 is capable of detecting Doppler frequencies over a 77.5 HZ bandwidth. Frequency selector 36 produces a signal, the frequency of which changes 64 times in about 32 ms., here from 10.24 MHZ to 10.87 MHZ in 10 KHZ steps. Consequently, the filter bank 38 may be viewed as being adapted to detect Doppler frequencies over a bandwidth 64 times the actual bandwidth of the filter bank 38. That is, the effective frequency coverage of the filter bank 38 may be viewed as being 640 KHZ. Therefore, such filter bank 38 may be viewed as being adapted to detect Doppler frequencies over the desired 4.96 KHZ bandwidth.

The Doppler frequency is determined by utilization device 40 of any known type, as a radar indicator. Such utilization device 40 is responsive to each one of the five filters making up filter bank 38 and is synchronized with the frequency selector 36. Determination of the frequency of the signal applied to spectrum analyzer 30 is made by utilization device 40 in a conventional manner by comparing the level of each signal passing through each one of the five filters in filter bank 38 synchronously with the stepping in frequency of the signal produced by frequency selector 36. A timing and control unit 42 provides synchronization of the time compressor 28 and the various subassemblies, (i.e. D.S.S.B.G. 37, DCO 39, utilization device 40) in spectrum analyzer 30.

TIME COMPRESSOR

Figures 3A, 3B:
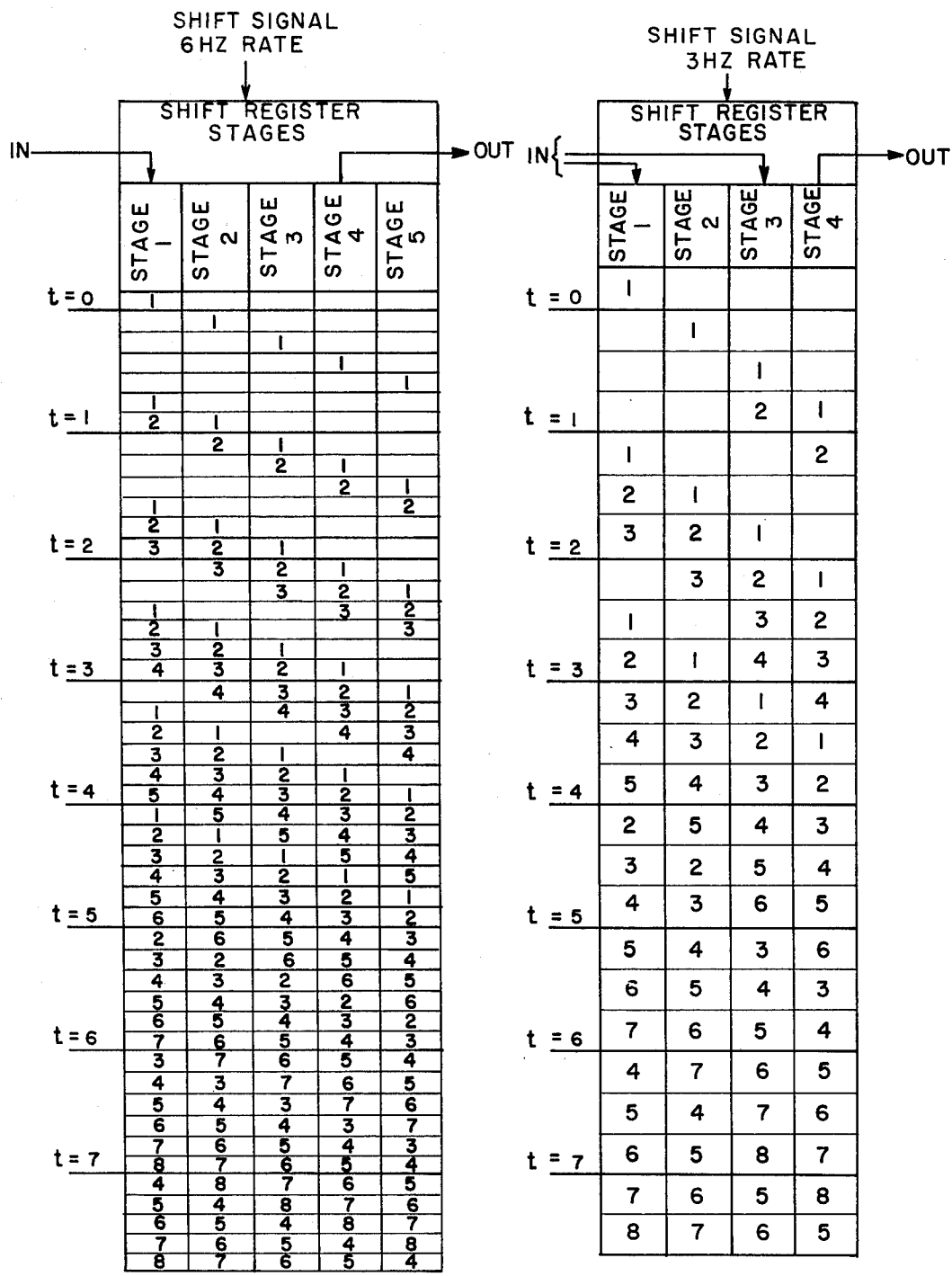
FIG. 3A is a table useful in understanding time compression according to the prior art.
FIG. 3B is a table useful in understanding time compression according to the invention.

Before proceeding with a discussion of such time compressor 28, shown in detail in FIG. 3, it is desirable to compare the process of time compression as described in U.S. Pat. No. 2,958,039 issued Oct. 25, 1960 to V. C. Anderson with the process of time compression as implemented here by time compressor 28. For purposes of such comparison it is assumed that sequential sets of six digital signals are to be processed. FIG. 3A shows a table useful in understanding the time compression process according to Anderson. However, for expository reasons, a five stage recirculating shift register is used as the Delay Line Time Compressor (Deltic) in place of the recirculating acoustic delay line of Anderson. Such shift register is adapted to have loaded into stage 1 thereof digital signals applied thereto at a 1 HZ rate. Each one of such digital signals is shifted from stage to stage (i.e. stage 1 to stage 2, then to stage 3, then to stage 4, then to stage 5, then to stage 1, etc.) in response to shift pulses occurring at a 6 HZ rate. Therefore, at time $t = 0$ sec. a first one of the digital signals, (1), is loaded into a first stage 1 of the shift register; the second one of the digital signals, (2), is loaded into first stage 1 at time $t = 1$ sec., and the third one of the digital signals, (3), is loaded into first stage 1 at time $t = 2$ sec. The process continues; however, it is noted that at time $t = 5$ sec. the sixth one of the digital signals, (6), is loaded into the first stage 1 of the shift register and the first one of the digital signals, (1), is no longer stored by the shift register. Consequently, it is readily apparent that the shift register stores the five most recent ones of the digital signals loaded therein. Pertinent data is read from the last stage (i.e. stage 5) of the shift register beginning at time $=4(5/6)$ seconds. It is noted that the digital signals stored in last stage (5) of the shift register are read out at a 6 HZ rate. Therefore, with such shift register used in the manner described by Anderson a time compression ratio of 6 has been attained. It is further noted that the pertinent data appears as sequential sets of digital signals, each one of such sets here being made up of six of the digital signals (i.e. digital signals 1–6; digital signals 2–7; digital signals 3–8, etc.

FIG. 3B shows a table useful in understanding the time compression process according to the implementation by time compressor 28. It is first noted for reasons to become apparent that a 4 stage recirculating shift register is shown. Here such shift register stores the four most recent digital words applied thereto at a 1 HZ rate. The shift register shown in FIG. 3B differs from that shown in FIG. 3A in that the digital signals are loaded selectively into either the first stage 1 or the third stage 3 thereof (and also that one less stage is required). This difference enables the shift register to operate at a 3 HZ rate. To put it another way, the first one of the digital signals, (1), is written into the first stage 1 at time $t = 0$. Such first digital signal (1) shifts from stage 1 to stage 2, then to stage 3, then to stage 4 at a 3 HZ rate. Because such first digital signal (1) is stored in stage 4 at time $t = 1$ sec., the second one of the digital signals (2) may then be written into stage 3 at time $t = 1$ sec. Likewise, the third one of the digital signals is loaded into stage 1 at time $t = 2$ sec.; the fourth one of the digital signals (4) is loaded into stage 3 at time $t = 3$ sec. etc. Pertinent data is read from the last stage (4) of the shift register at time $t = 3.67$ sec. It is noted that the digital signals stored in last stage (i.e. stage 4) are read therefrom at a 3 Hz rate. Therefore, with such a shift register using the process described in reference to FIG. 3B a time compression ratio of 3 has been attained. It is further noted that the pertinent data appears as sequential sets of digital signals, each one of such sets here being made up of six of the digital signals (i.e. digital signals 1–6; digital signals 3–8, etc.).

Referring again to FIG. 3 a time compressor 28 using the process described with reference to FIG. 3B is shown. A signal made up of a train of pulses having a 5.12 MHZ repetition rate (generated by timing and control 42, FIG. 2, in a manner to be described) is applied to a frequency divider network 50, here dividing the repetition rate of the signal from timing and control 42 by a factor of four. Such network 50 includes three flip flops 51 arranged in a conventional manner as shown to produce three signals, $\phi_1$, $\phi_2$, $\phi_B$. Signals $\phi_1$, $\phi_2$ and $\phi_B$, (the relative phase relationship being shown in FIG. 3C,) may each be characterized as a train of pulses having a 1.28 MHZ data rate. The digital signals produced by A/D converter 27 (FIG. 1) have each bit ($B_0$, $B_1$ - $B_4$) thereof available for storage in a memory 52. Memory 52 includes five cascaded 128 bit shift registers $53_1$-$53_5$ (here MOS shift registers responsive to a two phase clock signal produced by signals $\phi_1$ and $\phi_2$) arranged as a 640 stage recirculating memory. Such memory 52 is adapted to provide storage of the most recent 640 digital signals produced by A/D converter 27. Each memory 52 is analogous to the four stage recirculating shift register shown in FIG. 3B, such four stage recirculating shift register being viewed as a memory having two 2 bit shift registers. Digital signals from the A/D converter 27 (FIG. 1) are shifted from stage to stage through each one of the five 128 bit shift registers $53_1$ - $53_5$ of memory 52 by signals $\phi_1$ and $\phi_2$. That is, each stage of each 128 bit shift register $53_1$ - $53_2$ may be considered as being made up of two substages wherein data is loaded into one substage in response to signal $\phi_1$ and shifted into the second substage in response to signal $\phi_2$. For reasons to become apparent the digital signals produced by A/D converter 27 are loaded into the first stage of different ones of the five 128 bit shift registers, $53_1$ - $53_5$, under the control of signals $K_1$ to $K_5$. That is, the first one of the digital signals produced by A/D converter 27 (and every 5th one therafter) is loaded into the first stage of 128 bit shift register $53_1$; the second one of the digital signals produced by A/D converter 27 (and every first one thereafter) is loaded into the first stage of 128 bit shift register $53_2$. The third one of the digital signals produced by A/D converter 27 (and every fifth one thereafter) is loaded into the first stage of 128 bit shift register $53_3$; the fourth one of the digital signals produced by A/D converter 27 (and every fifth one thereafter) is loaded into the first stage of 128 bit shift register $53_4$; and the fifth one of the digital signals produced by A/D converter 27 (and every fifth one thereafter) is loaded into the first stage of 128 bit shift register $53_5$. For reasons to be discussed the digital signals are loaded into memory 52 at a 1280/129 KHZ data rate. Therefore, the operation of memory 52 in loading therein the digital signals from A/D converter 27 at such 1280/129 KHZ data rate and shifting such loaded digital signals through the various stages of each one of the five 128 bit shift registers $53_1$ - $53_5$ at a 1.28 MHZ rate is analogous to the operation of the shift register described in FIG. 3B; however, here a time compression ratio of 129 is attained. The operation of memory 52 described above is accomplished, for reasons to become apparent, because the first one of the digital signals produced by A/D converter 27 is loaded into the first stage 128 bit shift register $53_1$ by having memory 52 respond to signal $K_1$. Then such first digital signal is shifted from stage to stage at a 1.28 MHZ rate so that the second one of the digital signals produced by A/D converter 27 is loaded into the first stage of 128 bit shift register $53_2$ at a time 129/(1280 KHZ) seconds later by having memory 52 respond to signal $K_2$, such signal $K_2$ being produced at a time when such first digital signal has been shifted to the second stage of 128 bit shift register $53_2$. Such first and second digital signals are then shifted stage to stage at a 1.28 MHZ rate. The process repeats in a similar manner for a third, fourth and fifth digital signals. A sixth digital signal produced by A/D converter 27 is loaded into the first stage of 128 bit shift register $53_2$ by having memory 52 respond to signal $K_1$ and the process continues in the manner described for each succeeding digital signal produced by A/D converter 27.

Figure 3C:
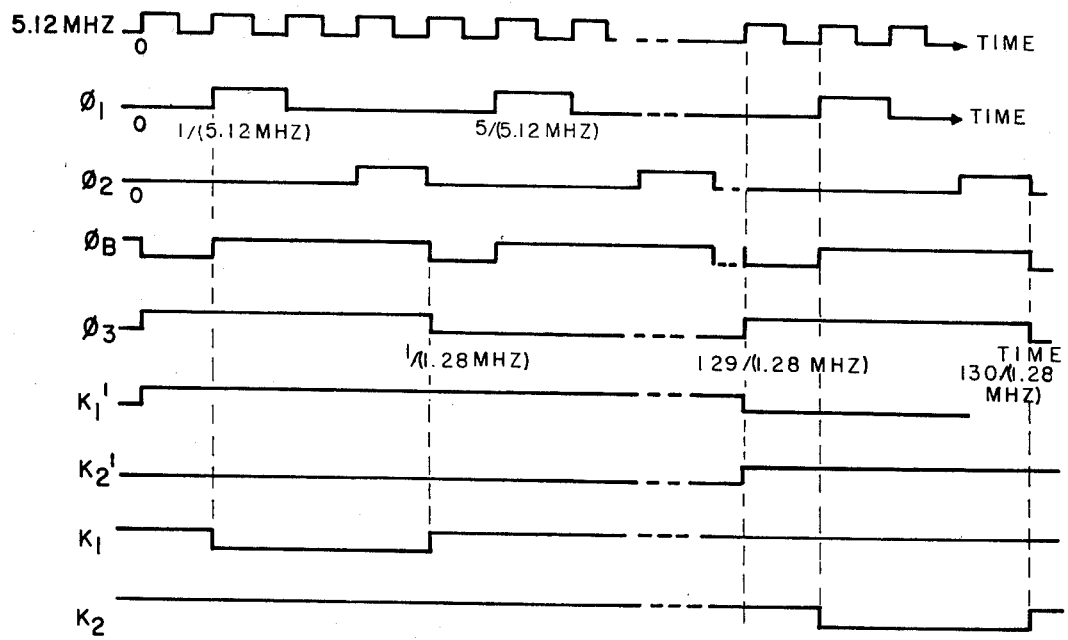
FIG. 3C shows an exemplary timing diagram useful in understanding an embodiment of a digital time compressor.

The signals $K_1$ to $K_5$ are generated in the following manner: Signal $\phi_2$ is passed through a frequency divider network 54, here dividing the 1.28 MHZ rate associated with signal $\phi_2$ by a factor of 129, to produce a signal $\phi_3$ having a 1280/129 KHZ rate. Such signal $\phi_3$ is here also used as a clocking signal for synchronizer 15 (FIG. 1). Such signal is shown in FIG. 3C. The signal $\phi_3$ is gated with a signal $\phi_B$ in AND gate 58. The signal $\phi_3$ is also used as clock pulses for a five bit self-starting shift register unit 56. The just mentioned unit may, for example, be any known type wherein the condition of the first four stages of a five stage shift register (not numbered) are sensed by a logic circuit (not numbered) which, if all such stages are empty, introduces a logic "one" to the input stage of such register in response to the next occuring $\phi_3$ pulse for shifting by succeeding $\phi_3$ pulses. The first to last stages (i.e. stages 1-5) of such shift register unit 56 thereby produce signals labeled $K_1'$ to $K_5'$ respectively. The signals $K_1'$ to $K_5'$ are gated with the signal produced by AND gate 58 in NAND gates 60 to 68 respectively as shown. The output of the NAND gates 60 to 68 are the signals $K_1$ to $K_5$ respectively. Representative ones of the signals $K_1'$, $K_2'$, $K_1$ and $K_2$ are shown in FIG. 3C where it may be observed that signal $K_1$ is "low" at the time the signal $\phi_1$ is first "high" and that $K_2$ is "low" at the time signal $\phi_1$ is high for the 130th time (i.e. $K_2$ is "low" after 129 pulses of signal $\phi_1$). The use of "low" as a gating signal is because of inverter 69. That is, when line 70 is "high" the bit, here $B_0$, passes through AND gate 71 and then into the first 128 bit shift register. Otherwise the data at the output of shift register $53_5$ passes through AND gate 72 in the manner described above.

DIGITALLY CONTROLLED OSCILLATOR

Figure 4A:
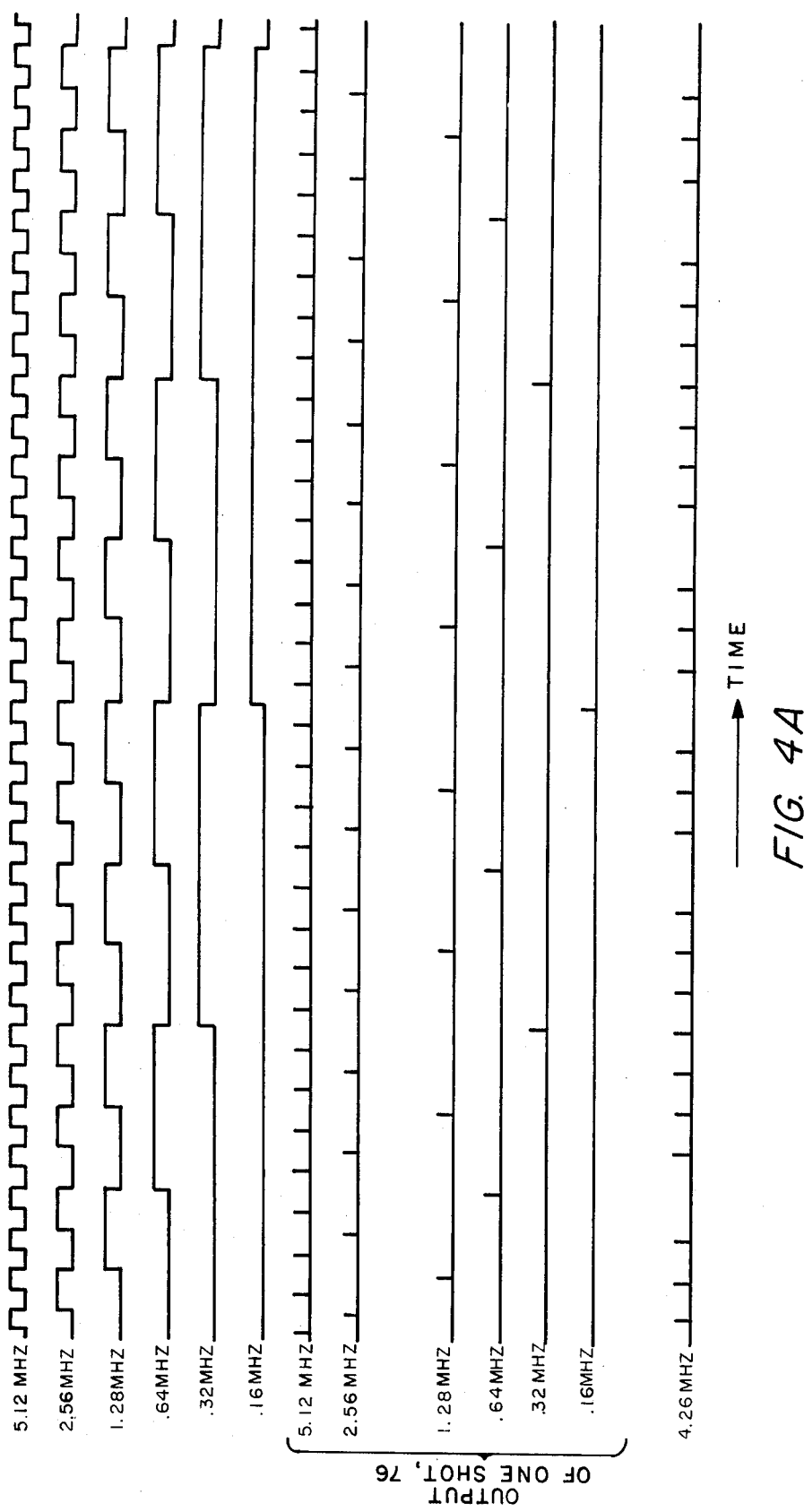
FIG. 4A shows an exemplary timing diagram useful in understanding the digital controlled oscillator shown in FIG. 4.

Referring now to FIG. 4, the details of digitally controlled oscillator (D.C.O. 39) are shown. The function of D.C.O. 39 here is to produce an output signal which may be characterized as a train of rectangular pulses having a 50% duty cycle and a frequency determined by a six bit digital control signal 82. In particular, the frequency of the output signal changes each 645/(1.28 MHZ) seconds through 64 10 KHZ steps from 0 KHZ to 630 KHZ cyclically in a time period 32.25 ms to produce an output signal having the above mentioned characteristics. Such frequency changes are mechanized here by providing a 20.48 MHZ clock 70 of timing and control 42 (FIG. 2) and passing its output through a flip-flop 73 whereby a first signal and its complement, both having a 10.24 MHZ rate, are produced. The first signal having a 10.24 MHZ rate is then passed through a frequency divider network 74 (here responsive to the positive going edge of each cycle of the first signal) to divide the frequency of the signal applied thereto by factors of 2, 4, 8, 16, 32 and 64. Therefore, six signals (each synchronized with the first signal) are produced at the output of network 74, the frequency of each one of such signals being respectively 5.12 MHZ, 2.56 MHZ, 1.28 MHZ, 0.64 MHZ, 0.32 MHZ and 0.16 MHZ. Each one of these six signals is passed to a different unistable, or one shot, multivibrator 76 (FIG. 4). Each such multivibrator is responsive only to the positive going edge of the applied signal so that the output of each is a train of pulses phased with respect to each other as shown in FIG. 4A. It should be noted that the trains of pulses out of the one shot multivibrators 76 are noncoincident in time. The six signals are selectively gated through AND gates 78 and OR gate 80 by such AND gates 78 responding to the six bit digital control signal to produce a signal, $16f_{DCO}$. Such six bit digital control signal 82 is generated by processing signal $K_1'$ (i.e. out of the shift register unit 56 (FIG. 3)) in a manner now to be discussed. Signal $K_1'$, as noted hereinbefore, may be characterized as a train of pulses at a frequency of 1280/645 KHZ and having a pulse width of 129/1.28 microseconds. Signal $K_1'$ is passed through a frequency divider network 84 of timing and control 42 (FIG. 2) here to divide the frequency of signal $K_1'$ by factors of 2, 4, 8, 16 and 64. The signals produced by each divider in network 84 may be characterized as having a frequency of 1280/1290 KHZ, 640/1290 KHZ, 320/1290 KHZ, 160/1290 KHZ, 80/1290 KHZ and 40/1290 KHZ, respectively. The signals produced at the output of network 84 then comprise the six bit digital control signal 82 applied to AND gates 78 as shown in FIG. 4. A little thought will make it apparent that the signal produced at the output of OR gate 80 (i.e. $16f_{DCO}$) may be characterized as a series of pulses having an average frequency equal to the total of the frequencies associated with each of the signals gating through AND gate 78 in response to control signal 82.

For example, at a time when the signals having frequencies of 2.56 MHZ, 1.28 MHZ and 0.32 MHZ are gating through AND gates 78 in response to the signals of control signal 82 having 80/1290 KHZ, 160/1290 KHZ and 640/1290 KHZ pulse repetition frequencies, the signal $16f_{DCO}$ may then be characterized as a train of pulses having a frequency of 4.26 MHZ. Such signal, labeled 4.26 MHZ, is shown in FIG. 4A. The signal $16f_{DCO}$ is passed through to a frequency divider network 86. Network 86 (FIG. 4) includes five flip-flops 88 arranged as shown. Four signals $f_{DCO}\angle 0°$, $f_{DCO}\angle 90°$, $f_{DCO}\angle 180°$, $f\angle 270°$ are, therefore, produced at the output of network 86, each one of such four signals having a frequency 1/16th the frequency of the signal $16f_{DCO}$. The signals $f_{DCO}\angle 0°$, $f_{DCO}\angle 90°$, $f_{DCO}\angle 180°$, $f_{DCO}\angle 270°$ are respectively delayed one from the other by one-quarter period. To put it another way, the signal $f_{DCO}\angle 0°$ switches between "1" and "0" every 16 pulses of the signal $16f_{DCO}$, the signal $f_{DCO}\angle 90°$ also switches between "1" and "0" every 16 pulses of the signal $16f_{DCO}$, however, signal $f_{DCO}\angle 90°$ switches one-quarter period after signal $f_{DCO}\angle 0°$. The same reasoning is applicable to the signals $f_{DCO}\angle 180°$ and $f_{DCO}\angle 270°$. A little thought will make it apparent that the signals at the output of network 86 will have approximately 50% duty cycle by using a higher frequency clock than the 20.48 MHZ clock 70 and a network 86 with a correspondingly higher division factor.

The network should in FIG. 4B may be used in place of a one shot multivibrator 76 and the AND gate 78 coupled thereto. FIG. 4B shows an exemplary network which may be used in place of the one shot multivibrator 76 coupled to the 2.56 MHZ rate signal and the AND gate 78 coupled to the 80/1290 KHZ signal. The network in FIG. 4B shows NOR gates 90–94 and AND 96. Such NOR gates 90–94 and AND gate 96 are constructed from Emitter Coupled Logic (ECL) devices. One signal into AND gate 96 is the 2.56 MHZ rate signal. The other signal into AND gate 96 is the 2.56 MHZ rate signal inverted and delayed by the inherent delay in NOR gates 90–94. Therefore, the signal at the output of OR gate 96 is equivalent to the signal at the output of a one shot multivibrator. AND gate 96 is coupled to the 80/1290 KHZ rate signal and such gate is equivalent to an AND gate 78 of network 97.

DIGITAL SINGLE SIDEBAND GENERATOR

Referring now to FIG. 5, digital single side band generator (D.S.S.B.G.) 37 is shown. D.S.S.B.G. 37 includes AND gates 100–106, OR gates 108, 110, 112 arranged as shown. The output of OR gate 112 is coupled to mixer 34 (FIG. 1). Two sets of signals are applied to the D.S.S.B.G. 37; one set is made up of the signals produced by the D.C.O. 39 (i.e. $f_{DCO}\angle 0°$, $f_{DCP}\angle 180°$ $f_{DCO}\angle 90°$ and $f_{DCO}\angle 270°$) the second set is made up of signals $f_{XO}\angle 0°$, $f_{XO}\angle 180°$, $f_{XO}\angle 90°$ and $f_{XO}\angle 270°$. The first two of the latter set of signals are produced by the first and the complementary signal out of the flip flop 72 and the last two are produced by dividing the signal produced by the 20.48 MHZ clock 70 (FIG. 2) in flip flop 114. Flip flop 114 is responsive to each negative going edge of the 20.48 MHZ clock so the signal $f_{XO}\angle 90°$ is delayed one-quarter period with respect to the signal $f_{XO}\angle 0°$ and the signals $f_{XO}\angle 180°$ and $f_{XO}\angle 270°$ are delayed one-half period with respect to $f_{XO}\angle 0°$ and $f_{XO}\angle 90°$, respectively. For convenience, let us call the signals $f_{DCO}\angle 0°$ and $f_{XO}\angle °$ "A" and "B" respectively and the signals $f_{DCO}\angle 90°$ and $f_{XO}\angle 90°$ "C" and "D" respectively. Therefore, D.S.S.B.G. 37 my be characterized as a logic network implementing the following equation:

$$A \cdot B + \overline{A} \cdot \overline{B} + C \cdot D + \overline{C} \cdot \overline{D} \qquad \text{(Eq. 1)}$$

Figure 5A:
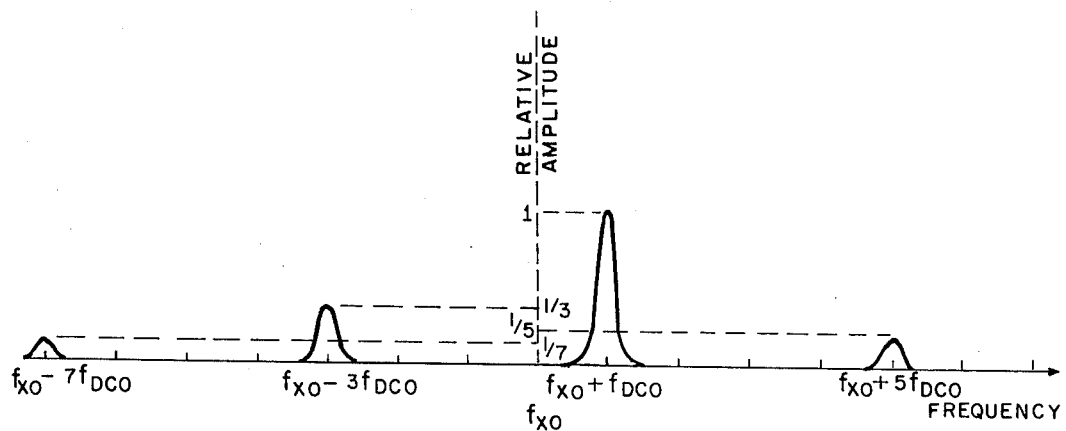
FIG. 5A shows an exemplary frequency spectrum of the signal produced at the output of the digital single side band generator shown in FIG. 5.

The response of D.S.S.B.G. 37 to the signals applied thereto has a frequency spectrum shown in FIG. 5A. It is noted in FIG. 5A that the signal at the output of D.S.S.B.G. 37 has a dominant frequency of $f_{XO} + f_{DCO}$, that is, 10.24 MHZ $+ f_{DCO}$. The D.S.S.B.G. 37 may be altered to produce a signal at its output having a dominant frequency of $f_{XO} - f_{DCO}$ by inserting an inverter network in circuit between OR gate 108 and OR gate 112 (FIG. 5). Such altered D.S.S.B.G. may be characterized as a logic network implementing the following equation:

$$\overline{A \cdot B + A \cdot B} + C \cdot D + \overline{C} \cdot \overline{D} \qquad \text{(Eq. 2)}$$

The frequency spectrum of such altered D.S.S.B.G. would have the same amplitude distribution as that shown in FIG. 5A. However, the main lobe, and succeedingly lower sidelobes would occur at frequencies $f_{XO} - f_{DCO}$, $f_{XO} + 3f_{DCO}$, $f_{XO} - 5f_{DCO}$, etc., respectively.

It is also noted that OR gate 112 may be replaced, for either the D.S.S.B.G. 37 shown or the D.S.S.B.G. modified in the manner just discussed by a conventional analog summing network. It should also be readily apparent that D.S.S.B.G. 37 (or the D.S.S.B.G. modified in the manner just discussed) may be implemented in various ways and expressed by various equations through conventional application of what is generally known in the art as De Morgan's theorem. Further, Eq. (1) and Eq. (2) may be expressed in different forms and then implemented to conform to any one of such different forms.

It is further noted that the D.S.S.B.G. 37 (or as altered) need only use signals A, B, C and D and not their complements. The rectangular waveforms of signal A or signal B need not be limited to one having a 50% duty cycle.

Having described preferred embodiments of the invention it will now be apparent to those of skill in the art that many changes may be made without departing from my inventive concept. For example, the time compressor 28 may take many forms other than that illustrated, as a core memory arranged in a manner described in my article ("Putting the Squeeze on Radar Signals", Electronics, Jan. 22, 1968, McGraw-Hill.) Further, many of the concepts herein described may be incorporated in a manner described in the article just referred to so as to enable a single filter bank to be time shared between many processors. Further, the time compressor 28, D.C.O. 39 and D.S.S.B.G. 37 may be used in other electronic systems as individual components. It is felt therefore that the invention herein described should not be restricted to its disclosed embodiments but rather should be limited only by the spirit and scope of the appended claims.

What is claimed is:

1. Apparatus for storing an input signal of time duration $T_1$ and for retrieving such stored input signal in a different, shorter time duration $T_2$, comprising:
    a. means for serially obtaining a predetermined number, N, of samples of the input signal at a rate $R_1$;
    b. a recirculating delay line having a plurality of serially coupled storage stages;
    c. means for shifting a sample stored in one of such stages to the next succeeding stage at a rate $R_2$, where $R_2$ is greater than $R_1$;
    d. means, operative as such shifting means shifts samples from stage to succeeding stage at the rate $R_2$, for storing a first one of such obtained samples in the $n$ th one of such stages and for storing the next succeeding one of such obtained samples in the $(n-1) + R_2/R_1$ th succeeding storage stage as the first one of such obtained samples shifts from such $n$ th one of such storage stages to the $n+R_2/R_1$ th stage; and
    e. means, coupled to one of such stages, for retrieving the N samples as such samples are shifted thereto at the rate $R_2$, such N samples being retrieved in the time duration $T_2$.

* * * * *